United States Patent
Moshe et al.

(10) Patent No.: US 7,135,904 B1
(45) Date of Patent: Nov. 14, 2006

(54) JITTER PRODUCING CIRCUITRY AND METHODS

(75) Inventors: David Moshe, D.N. Gilboa (IL); Erez Reches, Misgav (IL); Ido Naishtein, Haifa (IL)

(73) Assignee: Marvell Semiconductor Israel Ltd., Yokneam (IL)

(*) Notice: Subject to any disclaimer, the term of this patent is extended or adjusted under 35 U.S.C. 154(b) by 62 days.

(21) Appl. No.: 10/846,731

(22) Filed: May 13, 2004

Related U.S. Application Data

(60) Provisional application No. 60/535,907, filed on Jan. 12, 2004.

(51) Int. Cl.
*H03K 3/84* (2006.01)
(52) U.S. Cl. .................. 327/164; 714/724; 327/172
(58) Field of Classification Search ............... 327/164
See application file for complete search history.

(56) References Cited

U.S. PATENT DOCUMENTS

| | | | |
|---|---|---|---|
| 5,835,501 A * | 11/1998 | Dalmia et al. .............. 714/704 |
| 6,542,096 B1 | 4/2003 | Chan et al. ................. 341/100 |
| 2003/0023912 A1 | 1/2003 | Lesea ......................... 714/726 |
| 2003/0041294 A1* | 2/2003 | Moll et al. .................. 714/709 |
| 2003/0149922 A1 | 8/2003 | Lai .............................. 714/724 |
| 2005/0044463 A1* | 2/2005 | Frisch ......................... 714/738 |
| 2005/0097420 A1* | 5/2005 | Frisch et al. ................ 714/742 |

* cited by examiner

*Primary Examiner*—Long Nguyen
*Assistant Examiner*—Ryan Jager

(57) ABSTRACT

To facilitate measurement of the jitter tolerance of circuitry such as serializer/deserializer (SERDES) circuitry, test circuitry is provided that can add jitter to a data signal. The jitter added is preferably controllable and variable with respect to such parameters as jitter frequency (i.e., how rapid is the jitter) and/or amplitude (i.e., how large or great is the amount of the jitter).

54 Claims, 3 Drawing Sheets

JITTER PRODUCING CIRCUITRY AND METHODS

This application claims the benefit of provisional application 60/535,907, filed Jan. 12, 2004, which is hereby incorporated by reference herein in its entirety.

BACKGROUND OF THE INVENTION

This invention relates to circuitry and methods for causing a signal to jitter, e.g., to facilitate testing of the jitter-tolerance of circuitry receiving the signal.

An example of circuitry that may need to be tested for jitter-tolerance is serializer/deserializer (SERDES) circuitry. SERDES circuitry may be used in a transmitter for converting data supplied as a succession of parallel words to a continuous stream of serial bits. Circuitry that receives this serial data signal may use another SERDES to recover the successive bits from the received signal and reassemble those bits into successive parallel words for further processing. Clock data recovery (CDR) techniques may be used as part this data recovery operation. (The term "words" is used herein to mean any plural number of bits that may be treated as a significant unit of information. For example, a word may be eight bits; but a word can also be any other plural number of bits such as ten bits or 16 bits. There is no special significance to the use of the term word herein, and other terms such as nibble, byte, or group could have been used instead with no change in scope or coverage.)

In real-world applications the serial data signal received by a receiver is rarely, if ever, perfect. One of its imperfections may be jitter. Jitter is variation in the timing of transitions in the binary level of the received signal. Such transitions should occur only at boundaries between unit intervals (UIs) in the data signal. A UI is the time duration of any one bit in the data signal. It is not necessary for the data signal to transition after each UI; but when a transition does occur, it should be at the end of one UI and the start of the next UI. Because the UI is a fixed amount of time, transitions in the received serial data signal should occur only at certain times relative to one another (i.e., integer multiples of the UI). This fact may be used by a SERDES to help it synchronize its operations (e.g., its data recovery operations) to the incoming serial data signal. However, jitter can cause the timing of transitions in the received data signal to deviate from proper timing. For example, jitter can cause a transition in the received data signal to be delayed by some fraction of a UI, or to occur earlier than it should by some fraction of a UI. A SERDES should be able to tolerate some amount of jitter without losing its ability to correctly recover received serial data.

Known automatic test equipment (ATE) for production testing is not well adapted to producing serial data signals with jitter to facilitate production testing of the jitter tolerance of SERDES or other receiver circuitry. It would therefore be desirable to provide circuitry and methods for facilitating the use of automatic test equipment to test the jitter tolerance of circuitry such as SERDES circuitry.

SUMMARY OF THE INVENTION

In accordance with this invention, jitter can be added to a serial data signal by adding jitter to the clock signal that is used as the time base for the data signal. Jitter may be added to the clock signal by delaying that signal by a time-varying amount. In the presently preferred embodiments, the amount of this delay varies cyclically over time. The frequency of this cyclical variation may be controllable to allow variation of the frequency of the jitter. Alternatively or in addition, the maximum amount of the time delay variation may be controllable to allow variation of the magnitude or amplitude of the jitter. The data signal to which jitter has been added can be used to test the jitter-tolerance of circuitry that receives and must recover data from that signal. For example, circuitry for adding jitter to a data signal can be included in devices that are going to be tested (e.g., production-tested) using automatic test equipment (ATE). Such a device can then be tested using ATE and can itself generate a data signal having jitter for use in testing other components of the device (or other devices). Modification of the ATE is not required. The invention can be implemented in apparatus and/or method embodiments.

Further features of the invention, its nature and various advantages, will be more apparent from the accompanying drawings and the following detailed description of the preferred embodiments.

DETAILED DESCRIPTION

Figure 1:
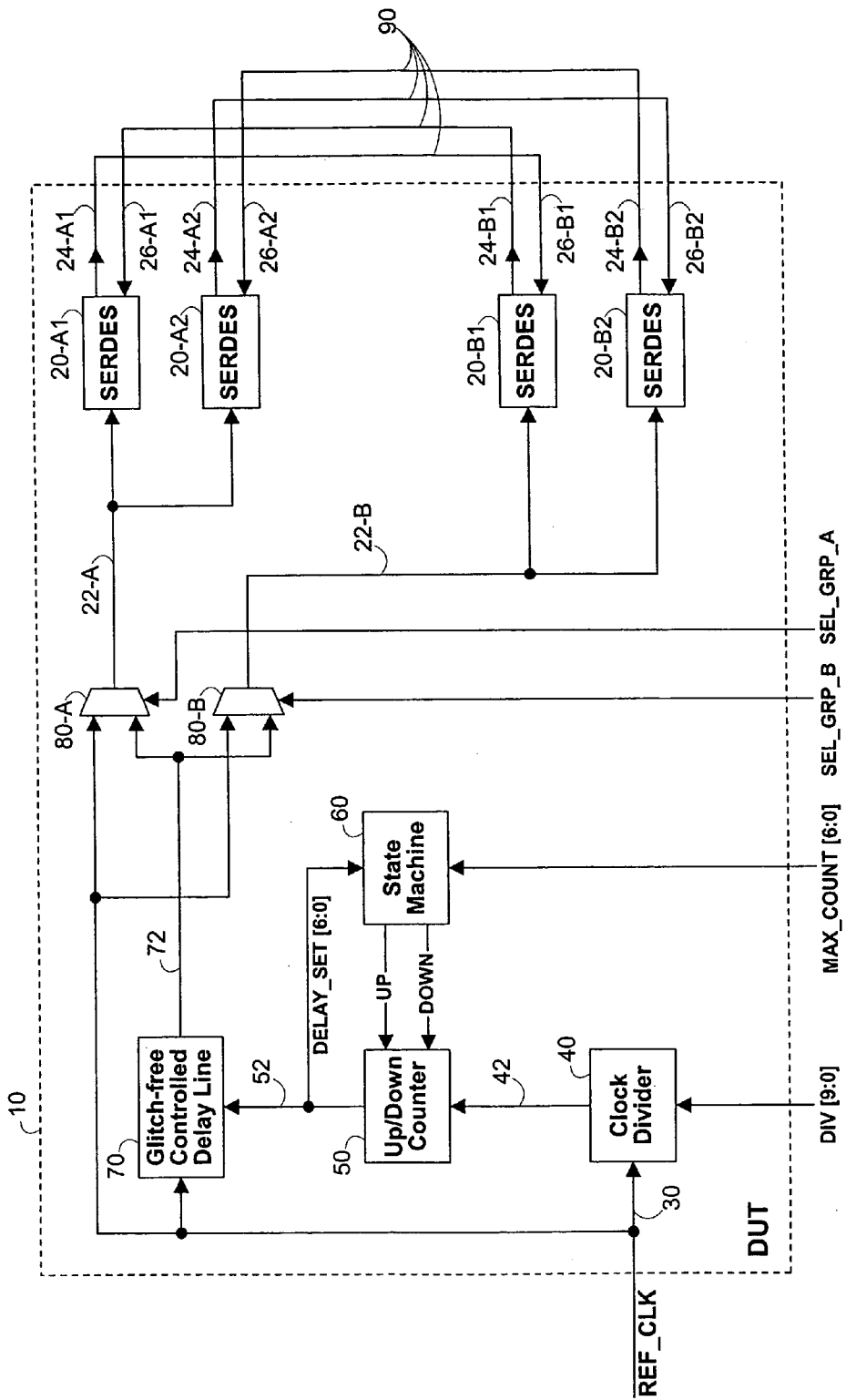
FIG. 1 is a simplified block diagram of an illustrative embodiment of circuitry constructed in accordance with the invention.

FIG. 1 shows an illustrative embodiment in which the invention is implemented largely as self-test circuitry that has been included in a device under test (DUT) 10. DUT 10 may also include other conventional circuitry that is not shown in FIG. 1; and that other circuitry can be of many different types and/or forms. Later it will be explained that implementing the invention as self-test circuitry is only one of many possibilities, and that the invention can be alternatively implemented in other ways and in other contexts if desired. For example, circuitry of the type shown in FIG. 1 (or at least the transmitter portion of that circuitry) can become part of test equipment (e.g., ATE) for use in testing the jitter tolerance of other devices.

In the illustrative embodiment shown in FIG. 1, DUT 10 includes four SERDES circuits 20-A1, 20-A2, 20-B1, and 20-B2, each of which can be conventional. Each SERDES circuit 20 receives a clock signal 22-A or 22-B, and may use the clock signal it receives to synchronize data output or transmitter operations of the SERDES. Such transmitter operations may include converting successive words of parallel data to a serial data output signal 24. This may include multiplying the frequency of the received clock signal 22 within the SERDES for at least some of the clock requirements of the SERDES. The data that each SERDES 20 outputs via its serial data output lead 24 can come from elsewhere (e.g., other circuitry on or off DUT 10), or it can be test data generated by the SERDES itself.

Another typical capability of each SERDES 20 is to receive a serial data signal 26 and convert that signal to successive words of parallel data. Each SERDES 20 may output the parallel words of data that it recovers to other circuitry on or off DUT 10, or (especially in a test mode of operation) the SERDES may use that data internally (e.g., comparing it to expected data to test whether it is correctly recovering data from incoming signal 26).

An overview of the remaining circuitry shown in FIG. 1 will now be provided. A master reference clock signal (REF_CLK) is supplied on lead 30. This signal can come from any suitable source on or off DUT 10. In the particular embodiment shown in FIG. 1 it is assumed that REF_CLK comes from test equipment (e.g., ATE) external to DUT 10. Elements 40, 50, 60, and 70 operate to produce (on lead 72) a version of REF_CLK having jitter. The frequency and/or amplitude of this jitter can be varied if desired. Multiplexer 80-A allows either the signal on lead 30 (REF_CLK) or the signal on lead 72 (REF_CLK with jitter) to be selected as the reference clock signal 22-A used by SERDES 20-A1 and 20-A2. Multiplexer 80-B allows a similar selection between signals 30 and 72 for the reference clock signal 22-B used by SERDES 20-B1 and 20-B2. The selection control signals (SEL_GRP_A and SEL_GRP_B) for multiplexers 80 can come from any suitable source on or off DUT 10. In the particular embodiment shown in FIG. 1 it is assumed that SEL_GRP_A and SEL_GRP_B come from test equipment external to DUT 10.

Continuing with the overview discussion, the FIG. 1 arrangement allows the reference clock signal 22-A applied to the group A SERDES (i.e., 20-A1 and 20-A2) to be the REF_CLK-with-jitter signal 72. At the same time, the reference clock signal 22-B applied to the group B SERDES (i.e., 20-B1 and 20-B2) can be the REF_CLK signal 30 without jitter. SERDES 20-A1 and 20-A2 can then be operated to output serial test data signals 24-A1 and 24-A2. Because SERDES 20-A1 and 20-A2 are operating with a reference clock signal 22-A having jitter, the serial data signals 24-A1 and 24-A2 will have similar jitter.

Output signal 24-A1 is applied to SERDES 20-B1 input 26-B1 via one of leads 90. (Leads 90 are shown as external to DUT-10 and are assumed in this embodiment to be connections that are established temporarily for testing purposes. It will be understood, however, that other ways of providing connections like 90 are also possible, including providing them as selectively usable connections on DUT 10.) If SERDES 20-B1 is able to correctly interpret the jittery data signal 26-B1 it receives, it is judged to be tolerant of that amount of jitter. SERDES 20-B1 may itself be able to determine whether it is correctly interpreting data, and may produce an output signal indicating when it is or is not achieving such correct interpretation. Alternatively, other circuitry (e.g., the test equipment testing DUT 10) may be used to receive the data SERDES 20-B1 recovers and to determine the correctness of that data. As mentioned above, the FIG. 1 circuitry may allow the jitter of signal 72 and therefore the jitter of signal 24-A1/26-B1 to be varied in frequency and/or amplitude. The ability of SERDES 20-B1 to tolerate jitter can thereby be tested over a range of jitter frequencies and/or amplitudes if desired.

At the same time that SERDES 20-B1 is being tested for tolerance to jitter in its incoming serial data signal 26-B1, SERDES 20-B2 can be tested for its tolerance to jitter in the similarly jittery serial data signal 26-B2 it receives via another one of leads 90 from the serial data output 24-A2 of SERDES 20-A2.

After SERDES 20-B1 and 20-B2 have been tested for jitter tolerance as described above, the process can be reversed to test the jitter tolerance of SERDES 20-A1 and 20-A2. For example, the states of multiplexers 80-A and 80-B may be reversed so that SERDES 20-B1 and 20-B2 receive the jittery reference clock signal (from lead 72) and SERDES 20-A1 and 20-A2 receive the no-jitter reference clock signal (from lead 30). The jittery serial data output signal 24-B1 of SERDES 20-B1 is applied via one of leads 90 to the serial data input lead 26-A1 of SERDES 20-A1 to test the jitter tolerance of that SERDES. Similarly, the jittery serial data output signal 24-B2 of SERDES 20-B2 is applied via another of leads 90 to the serial data input lead 26-A2 of SERDES 20-A2 to test the jitter tolerance of that SERDES.

After all desired jitter-tolerance testing has been performed, all of SERDES 20 can be operated with a normal REF_CLK signal from lead 30.

We turn now to a more detailed consideration of elements 40, 50, 60, and 70 in FIG. 1. Clock divider circuitry 40 receives REF_CLK signal 30 and a frequency division parameter value via leads DIV[9:0]. FIG. 1 shows the DIV[9:0] signals coming from an external source such as the test equipment being used to test DUT 10. It will be understood, however, that these signals can come from any suitable source on or off DUT 10. The value of parameter DIV[9:0] is preferably variable over time. Circuitry 40 produces a clock-type output signal 42 (divided clock or jitter control signal) having a frequency which is the REF_CLK signal frequency divided by the current value of parameter DIV. The frequency of divided clock signal 42 is at least partly determinative of the frequency of the jitter given the version of the reference clock signal on lead 72. The frequency of this jitter can therefore be changed by changing the value of the DIV parameter (assuming no change in the MAX_COUNT parameter discussed below). Increasing the value of DIV decreases the jitter frequency, and vice versa (again assuming no change in the MAX_COUNT parameter). In the illustrative embodiment being described, DIV[9:0] can have any value from 1 to 1024. It will be understood, however, that this is only an example, and that any desired range of values can be used for this parameter.

When enabled by an up output signal from state machine circuitry 60, up/down counter circuitry 50 responds to each cycle of the signal on lead 42 by incrementing a count it maintains and outputs via leads 52 (the signals DELAY_SET[6:0]). On the other hand, when state machine 60 is outputting a down signal, counter circuitry 50 decrements its count in response to each signal 42 cycle.

The operations of state machine 60 are controlled in part by the MAX_COUNT[6:0] signals it receives. If the value of the parameter represented by the MAX_COUNT signals is 0, state machine 60 enters or remains in a "no operation" state, in which it asserts neither up nor down. Accordingly, no jitter will be produced. On the other hand, if the value of the MAX_COUNT parameter is not 0, state machine 60 will assert up until DELAY_SET equals MAX_COUNT. Then state machine 60 will assert down until DELAY_SET equals 0. Then up will be asserted again, and so on, so that counter 50 repeatedly counts up and down between 0 and MAX_COUNT. It will soon become apparent how the value of parameter MAX_COUNT controls the amplitude of the jitter given to the signal on lead 72. MAX_COUNT can be varied to vary jitter amplitude if desired. (MAX_COUNT also has an effect on jitter frequency, as will be made clearer below.) FIG. 1 shows the MAX_COUNT signals coming from the test equipment being used to test DUT 10. But it will be understood that these signals can come from any suitable source on or off DUT 10.

In addition to being applied to state machine 60, the DELAY_SET[6:0] output signals 52 of up/down counter 50 are applied to glitch-free controlled delay line circuitry 70. This circuitry can delay the REF_CLK signal it also receives by any of many different amounts of delay, the amount of that delay being controlled by the current value of the DELAY_SET parameter. Output 72 of circuitry 70 is this selectively delayed REF_CLK signal.

An illustrative construction of circuitry 70 includes a plurality of signal delay circuit elements connected in series. For example, each of these delay circuit elements may delay the signal applied to it by 20 pS. One hundred of these elements may be connected in series, thereby providing a maximum delay of 2 nS. Output signal 72 may be derived from the output of any of these 100 delay elements, the current value of DELAY_SET controlling that selection. Accordingly, in this example DELAY_SET may have any value from 0 to 100. Of course, if MAX_COUNT is less than 100, then the highest value DELAY_SET will reach will be MAX_COUNT, not 100. Also, in this example the maximum value that MAX_COUNT can have is 100. It will be understood, however, that these particular values are only illustrative, and that the circuitry can be constructed to support (1) any amount of incremental delay of REF_CLK, and (2) any number of such increments.

Circuitry constructed in accordance with the invention may be capable of a wider range of operation, but in any particular test it will generally be desirable to limit the amplitude of the jitter (i.e., the maximum amount of delay of REF_CLK by circuitry 70) to some fraction of UI. The frequency of the jitter is also logically limited to a fraction of the expected maximum serial bit rate of the circuitry being tested. Moreover, there may be a relationship between these two variables, because most systems to be tested will probably be able to tolerate higher amplitude jitter at lower jitter frequencies, but only lower amplitude jitter at higher jitter frequencies. In any event, the circuitry of this invention is able to provide any desired combination of jitter frequency and amplitude.

Figure 2:
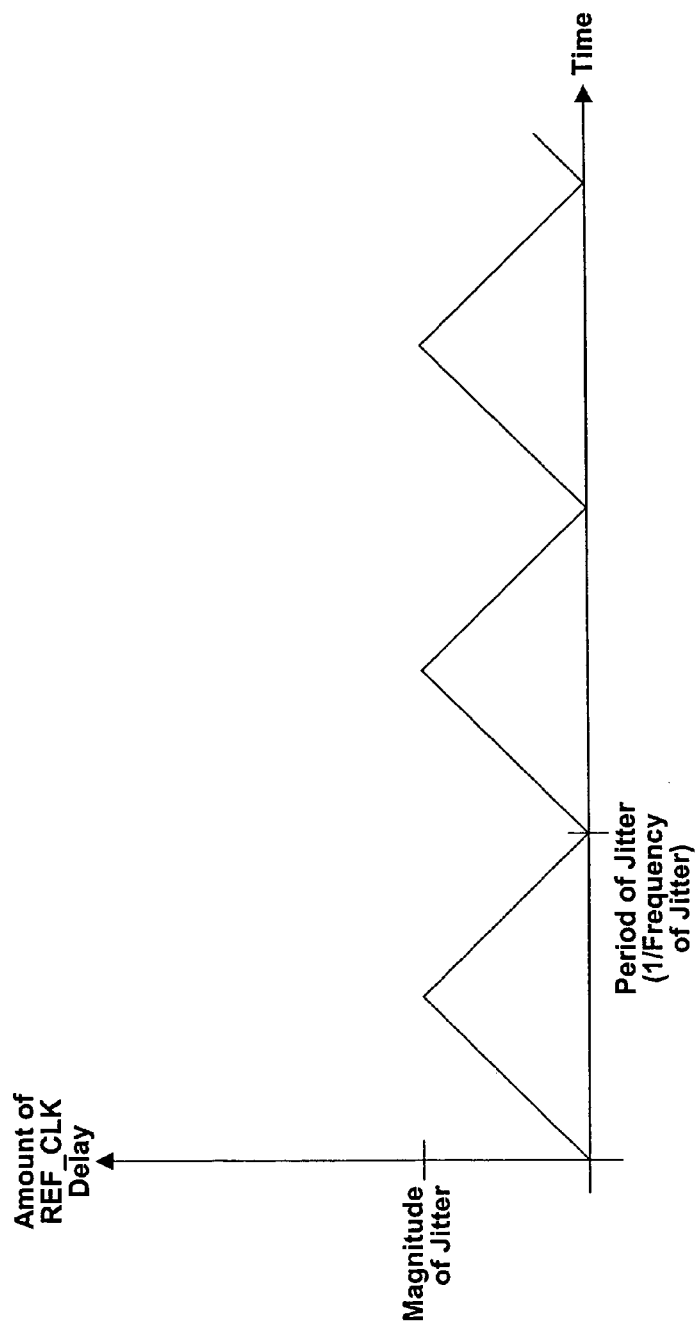
FIG. 2 is an illustrative graph of circuit operation information that is useful in explaining certain aspects of the invention.

FIGS. 2–5 are provided to ensure that the concepts of frequency and amplitude of jitter are clear. FIG. 2 is a plot of the amount by which signal 72 is delayed relative to signal 30 as a test proceeds with particular values for jitter frequency and amplitude. (FIG. 2 can also be thought of as a plot of the DELAY_SET parameter value over time.) The peak-to-peak "magnitude" of the jitter is the maximum amount of delay of signal 72 relative to signal 30. This is computable as MAX_COUNT*TAP_DELAY, where TAP_DELAY is the delay increment characteristic of circuitry 70. (Alternatively, jitter "amplitude" may be thought of as one-half the peak-to-peak excursion shown in FIG. 2, in which case amplitude will be computed as MAX_COUNT*TAP_DELAY/2.) The period of the jitter is the time required for the delay of signal 72 relative to signal 30 to go from 0 to maximum and then back to 0 again. Jitter frequency is the reciprocal of jitter period, which is computable as FMOD=REF_CLK/(2*MAX_COUNT*DIV). It will thus be seen that jitter frequency is a function of both DIV and MAX_COUNT.

Figure 3:
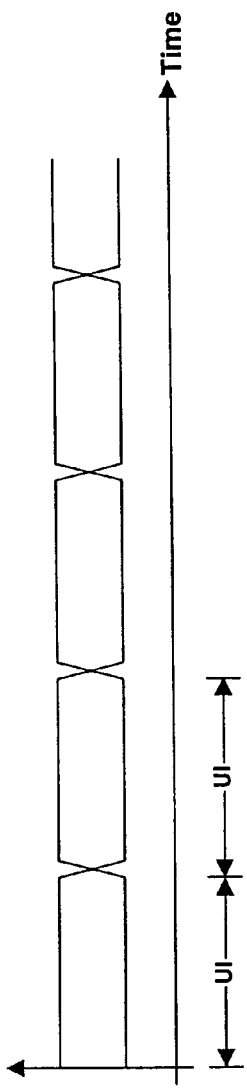
FIG. 3 is an illustrative graph of signal information that is useful in explaining certain aspects of the invention.

FIG. 3 shows the UIs in a serial data signal with no jitter. (The time scale of FIG. 3 is different from that of FIG. 2, but the same as that of FIG. 4). FIG. 3 shows the locations of all possible transitions in the data signal, and therefore the measure of UI for the depicted signal.

Figure 4:
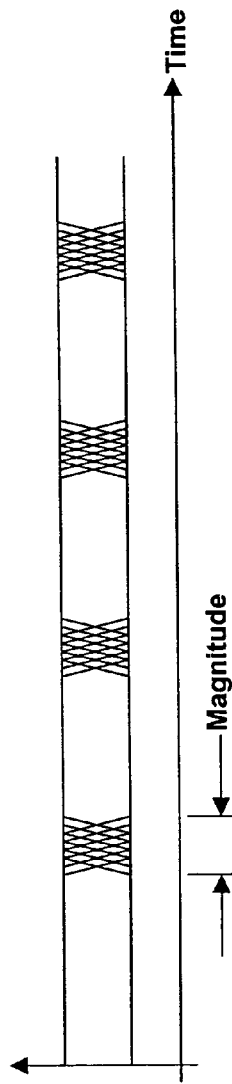
FIG. 4 is a graph showing illustrative modification of the FIG. 3 signal information in accordance with the invention.

FIG. 4 shows the addition of jitter to the FIG. 3 signal information in accordance with this invention. FIG. 4 shows that this jitter can cause each possible transition in the FIG. 3 signal to be somewhat delayed (typically by some fraction of a UI). The maximum amount of this delay is labelled as the "magnitude" of jitter in FIG. 4.

Figure 5:
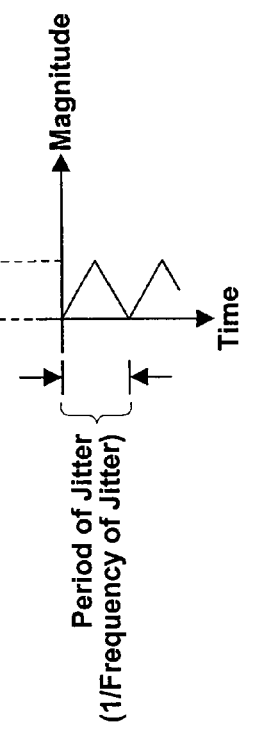
FIG. 5 is similar to FIG. 2, but is redrawn in relationship to FIG. 4.

FIG. 5 is plotted on a time axis that is perpendicular to the FIG. 4 time axis (and with magnitude of delay in FIG. 4 transferred to the magnitude axis in FIG. 5) to show that over time the amount of delay in the FIG. 4 jitter alternately increases and decreases. FIG. 5 is therefore identical to FIG. 2, but rotated 90° and linked to one illustrative transition time in FIG. 4.

It will be understood that the foregoing is only illustrative of the principles of the invention, and that various modifications can be made by those skilled in the art without departing from the scope and spirit of the invention. For example, the circuitry shown as DUT 10 in FIG. 1 (or at least part of that circuitry) can be made part of test equipment (e.g., ATE) for testing the jitter tolerance of other devices. One or more of the serial data outputs 24 of the FIG. 1 circuitry would then be connected to the serial data inputs (similar to 26) of the SERDES or other receiver circuitry of another device to be tested for jitter tolerance. That other device could also receive the REF_CLK signal without jitter. The FIG. 1 circuitry would be operated generally as described above to produce one or more serial data output signals 24 with jitter. The ability of the SERDES or other receiver circuitry in the other device to correctly interpret that jittery data would provide a measure of the jitter tolerance of the other device.

As used herein and in the appended claims, the word "successive" does not necessarily mean immediately following. It can just mean later in time.

The invention claimed is:

1. A method of adding jitter to a clock signal comprising:
   delaying successive cycles of the clock signal by a cyclically changing amount; and
   cyclically changing the amount of delay by a plurality of unit delay increments, wherein said cyclically changing comprises controlling amplitude of the cyclically changing amount of delay by selecting a maximum number of the plurality of unit delay increments to cyclically change the amount of delay.

2. The method defined in claim 1 wherein the cyclically changing comprises:
   controlling frequency of the cyclically changing amount of delay.

3. The method defined in claim 2 wherein the controlling frequency is at least partly responsive to frequency of the clock signal.

4. The method defined in claim 2 wherein controlling the frequency comprises:
   selecting a rate for cyclically changing the amount of delay by the plurality of unit delay increments.

5. The method defined in claim 3 wherein the controlling frequency comprises:
   dividing the frequency of the clock signal by a divisor parameter.

6. The method defined in claim 5 wherein the divisor parameter is variable.

7. The method defined in claim 1 wherein the controlling amplitude is at least partly responsive to an amplitude parameter.

8. The method defined in claim 7 wherein the amplitude parameter is variable.

9. Apparatus for adding jitter to a clock signal comprising:
   means for delaying successive cycles of the clock signal by a cyclically changing amount; and
   means for cyclically changing the amount of delay by a plurality of unit delay increments, wherein said means for cyclically changing comprises means for controlling amplitude of the cyclically changing amount of delay by means for selecting a maximum number of the plurality of unit delay increments to cyclically change the amount of delay.

10. The apparatus defined in claim 9 wherein the means for cyclically changing comprises:
means for controlling frequency of the cyclically changing amount of delay.

11. The apparatus defined in claim 10 wherein the means for controlling frequency is at least partly responsive to frequency of the clock signal.

12. The apparatus defined in claim 10 wherein the means for controlling frequency comprises:
means for selecting a rate for cyclically changing the amount of delay by the plurality of unit delay increments.

13. The apparatus defined in claim 11 wherein the means for controlling frequency comprises:
means for dividing the frequency of the clock signal by a divisor parameter.

14. The apparatus defined in claim 13 wherein the divisor parameter is variable.

15. The apparatus defined in claim 9 wherein the means for controlling amplitude is at least partly responsive to an amplitude parameter.

16. The apparatus defined in claim 15 wherein the amplitude parameter is variable.

17. Apparatus for adding jitter to a clock signal comprising:
delay circuitry that delays successive cycles of the clock signal by a cyclically changing amount; and
control circuitry that cyclically changes the amount of delay by a plurality of unit delay increments, wherein said control circuitry comprises amplitude control circuitry that controls amplitude of the cyclically changing amount of delay having circuitry that selects a maximum number of the plurality of unit delay increments to cyclically change the amount of delay.

18. The apparatus defined in claim 17 wherein the control circuitry comprises:
frequency control circuitry that controls frequency of the cyclically changing amount of delay.

19. The apparatus defined in claim 18 wherein the frequency control circuitry is at least partly responsive to frequency of the clock signal.

20. The apparatus defined in claim 19 wherein the frequency control circuitry comprises:
frequency dividing circuitry that divides the frequency of the clock signal by a divisor parameter.

21. The apparatus defined in claim 20 wherein the divisor parameter is variable.

22. The apparatus defined in claim 18 wherein the frequency control circuit comprises:
circuitry that selects a rate for cyclically changing the amount of delay by the plurality of unit delay increments.

23. The apparatus defined in claim 17 wherein the amplitude control circuitry is at least partly responsive to an amplitude parameter.

24. The apparatus defined in claim 23 wherein the amplitude parameter is variable.

25. A method of adding jitter to a clock signal comprising:
delaying successive cycles of the clock signal by a cyclically changing amount using a plurality of unit delay elements connected in series, the number of unit delay elements being selectable and ranging from all to none of the plurality of unit delay elements, wherein the unit delay elements delay the successive cycles of the clock signal by cyclically changing the number of selected unit delay elements.

26. The method defined in claim 25 wherein the delaying comprises:
controlling frequency of the cyclically changing amount of delay.

27. The method defined in claim 26 wherein controlling the frequency comprises:
selecting a rate for cyclically changing the number of selected unit delay elements.

28. The method defined in claim 26 wherein the controlling frequency is at least partly responsive to frequency of the clock signal,.

29. The method defined in claim 28 wherein the controlling frequency comprises:
dividing the frequency of the clock signal by a divisor parameter.

30. The method defined in claim 29 wherein the divisor parameter is variable.

31. The method defined in claim 25 wherein the delaying comprises:
controlling amplitude of the cyclically changing amount of delay.

32. The method defined in claim 31 wherein controlling the amplitude comprises:
selecting a maximum number of selected unit delay elements to cyclically change the amount of delay.

33. The method defined in claim 31 wherein the controlling amplitude is at least partly responsive to an amplitude parameter.

34. The method defined in claim 33 wherein the amplitude parameter is variable.

35. Apparatus for adding jitter to a clock signal comprising:
means for delaying successive cycles of the clock signal by a cyclically changing amount using a plurality of unit delay means connected in series, the number of unit delay means being selectable and ranging from all to none of the plurality of unit delay means, wherein the unit delay means delay the successive cycles of the clock signal by cyclically changing the number of selected unit delay means.

36. The apparatus defined in claim 35 wherein the means for delaying comprises:
means for controlling frequency of the cyclically changing amount of delay.

37. The apparatus defined in claim 36 wherein the means for controlling the frequency comprises:
means for selecting a rate for cyclically changing the number of selected unit delay means.

38. The apparatus defined in claim 36 wherein the means for controlling frequency is at least partly responsive to frequency of the clock signal.

39. The apparatus defined in claim 38 wherein the means for controlling frequency comprises:
means for dividing the frequency of the clock signal by a divisor parameter,.

40. The apparatus defined in claim 39 wherein the divisor parameter is variable.

41. The apparatus defined in claim 35 wherein the means for delaying comprises:
means for controlling amplitude of the cyclically changing amount of delay.

42. The apparatus defined in claim 41 wherein the means for controlling the amplitude comprises:

means for selecting a maximum number of selected unit delay means to cyclically change the amount of delay.

43. The apparatus defined in claim 41 wherein the means for controlling the amplitude is at least partly responsive to an amplitude parameter.

44. The apparatus defined in claim 43 wherein the amplitude parameter is variable.

45. Apparatus for adding jitter to a clock signal comprising:

delay circuitry that delays successive cycles of the clock signal by a cyclically changing amount using a plurality of unit delay elements connected in series, the number of unit delay elements being selectable and ranging from all to none of the plurality of unit delay elements, wherein the unit delay elements delay the successive cycles of the clock signal by cyclically changing the number of selected unit delay elements.

46. The apparatus defined in claim 35 wherein the delay circuitry comprises:

frequency control circuitry that controls frequency of the cyclically changing amount of delay.

47. The apparatus defined in claim 36 wherein the frequency control circuitry comprises:

circuitry that selects a rate for cyclically changing the number of selected unit delay elements.

48. The apparatus defined in claim 36 wherein the frequency control circuitry is at least partly responsive to frequency of the clock signal.

49. The apparatus defined in claim 38 wherein the frequency control circuitry comprises:

frequency dividing circuitry that divides the frequency of the clock signal by a divisor parameter,.

50. The apparatus defined in claim 39 wherein the divisor parameter is variable.

51. The apparatus defined in claim 35 wherein the delay circuitry comprises:

amplitude control circuitry that controls amplitude of the cyclically changing amount of delay.

52. The apparatus defined in claim 41 wherein the amplitude control circuitry comprises:

amplitude selection circuitry that selects a maximum number of unit delay elements to cyclically change the amount of delay.

53. The apparatus defined in claim 41 wherein the amplitude control circuitry is at least partly responsive to an amplitude parameter.

54. The apparatus defined in claim 43 wherein the amplitude parameter is variable.

* * * * *